United States Patent
Hartmann et al.

(10) Patent No.: US 7,088,122 B2
(45) Date of Patent: Aug. 8, 2006

(54) TEST ARRANGEMENT FOR TESTING SEMICONDUCTOR CIRCUIT CHIPS

(75) Inventors: Udo Hartmann, Neuried (DE); Thierry Canaud, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/922,005

(22) Filed: Aug. 19, 2004

(65) Prior Publication Data

US 2005/0068055 A1    Mar. 31, 2005

(30) Foreign Application Priority Data

Aug. 19, 2003    (DE)    ................. 103 38 079

(51) Int. Cl.
  *G01R 31/28*    (2006.01)
  *H03K 19/00*    (2006.01)
(52) U.S. Cl. ........................ 324/765; 714/724
(58) Field of Classification Search .............. None
    See application file for complete search history.

(56) References Cited

U.S. PATENT DOCUMENTS

| 4,780,670 | A | * | 10/1988 | Cherry ....................... 324/754 |
| 5,070,297 | A | * | 12/1991 | Kwon et al. ................. 324/754 |
| 6,150,831 | A | * | 11/2000 | Asai et al. ................... 324/765 |
| 6,360,180 | B1 | * | 3/2002 | Breger ........................ 702/108 |
| 6,452,411 | B1 | * | 9/2002 | Miller et al. ................. 324/765 |
| 6,583,639 | B1 | * | 6/2003 | Vogley ........................ 324/765 |
| 6,591,385 | B1 | * | 7/2003 | Krech et al. ................. 714/718 |
| 6,603,324 | B1 | * | 8/2003 | Eldridge et al. ............ 324/755 |

* cited by examiner

*Primary Examiner*—Ernest Karlsen
(74) *Attorney, Agent, or Firm*—Dicke, Billig & Czaja, PLLC

(57) ABSTRACT

The invention relates to a test arrangement for testing semiconductor circuit chips, in which a test signal received via a primary test channel from a driver amplifier of an item of test equipment is distributed via parallel sub-channels to a plurality of inputs of one or more semiconductor circuit chips under test the test arrangement having signal buffering circuits arranged in each sub-channel that receive and buffer the test signal from the driver amplifier before feeding it to the inputs of the semiconductor circuit chip(s).

20 Claims, 4 Drawing Sheets

TEST ARRANGEMENT FOR TESTING SEMICONDUCTOR CIRCUIT CHIPS

CROSS-REFERENCE TO RELATED APPLICATIONS

This Utility Patent Application claims priority to German Patent Application No. DE 103 38 079.5, filed on Aug. 19, 2003, which is incorporated herein by reference.

FIELD OF THE INVENTION

The invention relates to a test arrangement for testing semiconductor circuit chips, and more particularly, to a test arrangement in which a test signal received via a primary test channel from a driver amplifier of an item of test equipment is distributed via parallel sub-channels to a plurality of inputs of one or more semiconductor circuit chips under test.

BACKGROUND

Test systems are equipped by their manufacturer with a certain number of output channels that enable a certain number of chips to be tested in parallel. For example, as illustrated in the enclosed FIG. 1, a test signal from a transmit driver (DRV) is distributed in parallel to four functionally identical pins X of four chips under test via a test channel having a line impedance of 50 Ohms.

In order to save costs, one always aims to increase parallelism, to which end one DRV is no longer connected to one pin of a chip but is connected in parallel to functionally identical pins of a plurality of chips. This concept is also known as the "shared driver" concept. For example, a memory tester from Advantest, type T5571P, contains 480 transmit drivers and 288 IOs for 16 DUTs (Devices Under Test), where 30 DRVs and 18 IOs are used for each DUT.

In the test arrangement illustrated in FIG. 1, based on the shared driver concept, the inputs of the chips under test do not draw more current in total than the DRV can supply. The line impedance or output impedance of the DRV of 50 Ohms must also be taken into account, because a potential divider is created by the output impedance and the parallel connection of the input resistances Rin1, Rin2, ..., Rin4 of the chips as illustrated in FIG. 2.

If, as illustrated in FIG. 4, a short-circuit occurs in one of the pins of a chip, indicated by the input impedance of 0 Ohms, the test signal becomes 0 (0 V) and is therefore no longer available for the other chips either. This means that the one faulty chip turns the other potentially good chips into failed chips during testing, reducing the yield. In order to avoid this problem caused by the short-circuit of a chip input or pin, in one design, series resistors are inserted in the separate secondary signal lines (see FIG. 3). This only works for high impedance inputs, however, because this is also a potential divider. FIG. 5 illustrates that when using such series resistors as in FIG. 3, in the worst-case situation when one pin is short-circuited, a three-element potential divider is formed from the 50 Ohm output impedance of the DRV, the 1 kOhm series resistor and the input impedance of the chip. For every short-circuited chip input or pin, there is an incremental reduction in the voltage to the other chips.

Hence it is one object of the invention to make possible using few means, by extending the shared driver concept, a generic test arrangement without loss of yield from potentially short-circuited chips.

SUMMARY

The invention relates to a test arrangement for testing semiconductor circuit chips, in which a test signal received via a primary test channel from a driver amplifier of an item of test equipment is distributed via parallel sub-channels to a plurality of inputs of one or more semiconductor circuit chips under test, the test arrangement having signal buffering circuits arranged in each sub-channel that receive and buffer the test signal from the driver amplifier before feeding it to the inputs of the semiconductor circuit chip(s).

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
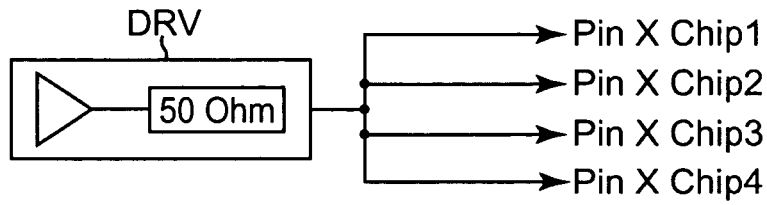
FIGS. 1–5 illustrate schematically prior known test arrangements.
Figure 2:
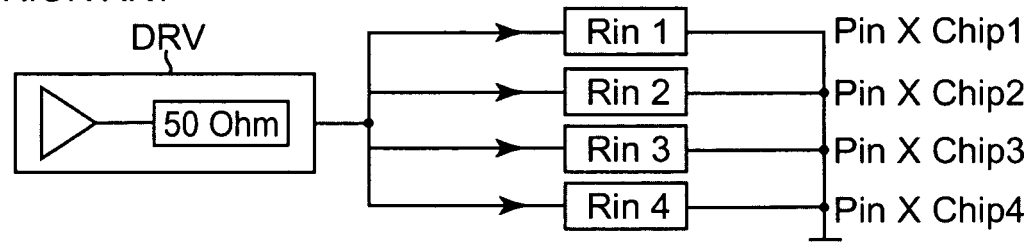
Figure 3:
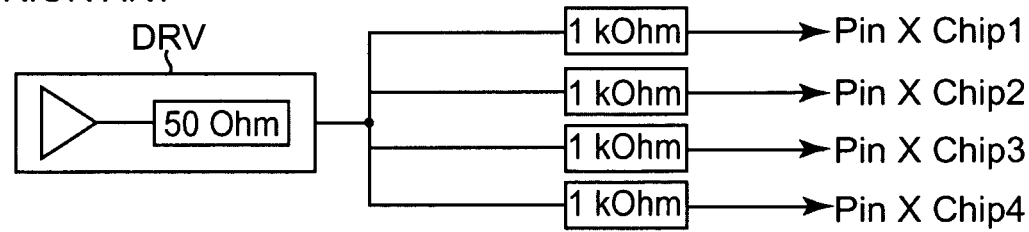
Figure 4:
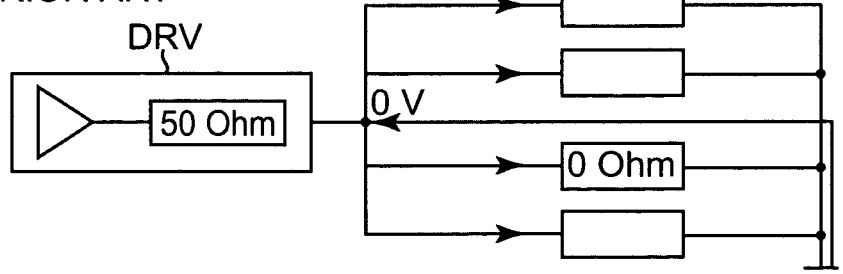
Figure 5:
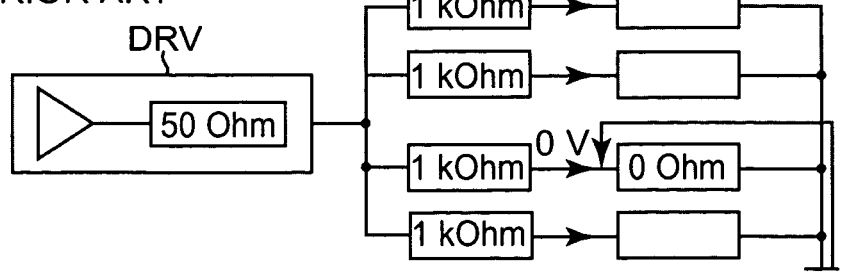

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Hence it is one object of the invention to make possible using few means, by extending the shared driver concept, a generic test arrangement without loss of yield from potentially short-circuited chips.

Owing to the fact that, according to a key aspect of the invention, the test arrangement has signal buffering circuits arranged in each sub-channel that receive and buffer the test signal from the driver amplifier before feeding it to the inputs of the semiconductor circuit chip(s), only the individual sub-channel is affected by a short-circuit, not the whole "shared driver" test arrangement.

In the test arrangement, preferably all the buffering circuits have the same circuit arrangement and each consist of a field effect transistor and a pull-up resistor, where the drain or source electrode of each field effect transistor is connected to one end of the associated pull-up resistor and to the respective chip input via the associated sub-channel, the gate electrodes of the field effect transistors are connected in common to the driver amplifier, and the other electrodes of the drain and source electrodes of the field effect transistors that are not connected to the pull-up resistor are connected in common to ground, and the other ends of the pull-up resistors are connected to at least one freely selectable voltage source.

The freely selectable voltage source means that one can draw more current in total than from one driver amplifier and the parallelism of the test arrangement is increased. In addition, the freely selectable voltage source means that a voltage source with a very low output impedance can be used. As explained above with reference to FIG. 1 to 5, this is an advantage compared with a usual driver amplifier (potential divider).

The required signal is restored at the chip input by inverting the test signal from the driver amplifier:

a "high" output signal from the driver amplifier means the field effect transistor is on and 0 V is applied to the chip;

a "low" output signal from the driver amplifier means the field effect transistor is off and the voltage from the voltage source is applied to the chip input via the pull-up resistor.

It is not necessary to invert the output signal of the driver amplifier if one uses a depletion-type p-channel MOSFET for the field effect transistor, as is done in one exemplary embodiment.

It is possible to define the rising edge of the test signal applied to the chip input by selecting the field effect transistor (transconductance) and the pull-up resistor.

Owing to the unrestricted selection of the voltage source, levels that are not available from the test equipment can be applied (with an external voltage source). Owing to the unrestricted selection of the voltage source, more different levels than are available from the test equipment can be applied (with an external voltage source). Instead of connecting one end of the FETs to ground, one can also use an additional voltage source to generate a logical "0" level having a voltage that is different from the ground potential, e.g. −1 V.

Figure 6:
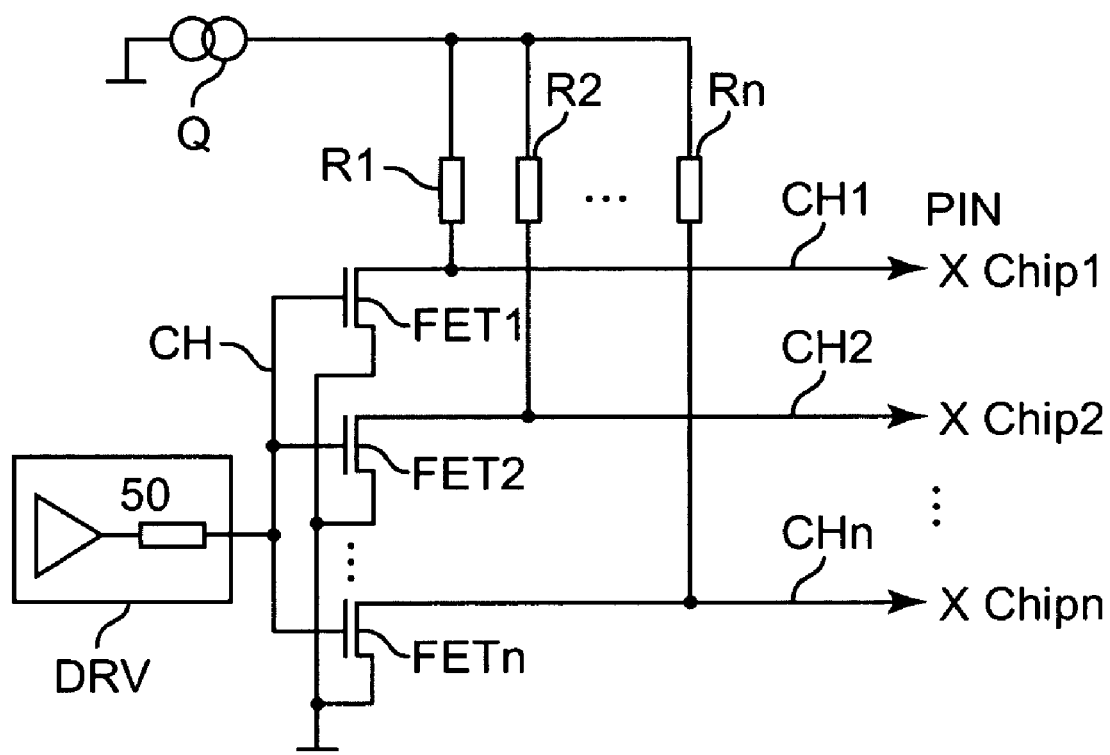
FIG. 6 illustrates schematically a first exemplary embodiment of a test arrangement according to the invention.

FIG. 6 illustrates an exemplary embodiment of a test arrangement according to the invention illustrated schematically at 20. A test signal generated by a driver amplifier DRV, having an output impedance of 50 Ohms, for example, of an item of test equipment otherwise specified in no further detail, is distributed via a primary test channel CH and signal buffering circuits via n sub-channels CH1, CH2, . . . , CHn to signal inputs X of a plurality of semiconductor circuit chips 1, 2, . . . , n.

The signal inputs X of the chips 1-n each have the same function, and the signal buffering circuits all have the same circuit arrangement. They each consist of a field effect transistor FET1, FET2, . . . , FETn and a pull-up resistor R1, R2, . . . , Rn connected to the drain or source of the respective field effect transistor. The other ends of the pull-up resistors R1, R2, . . . , Rn are connected in common to a freely selectable voltage source Q. The gate electrodes of all field effect transistors are connected in common to the primary test channel, and each of the other drain or source electrodes of the field effect transistors FET1, FET2, . . . , FETn is connected in common to ground. Instead of connecting one end of the FETs to ground, one can also use an additional voltage source to generate a logical "0" level having a voltage that is different from the ground level, e.g. −1 V.

Using the signal buffering circuits shown in FIG. 6, the test signal received via the primary test channel CH from the driver DRV is in each case buffered by a field effect transistor and a pull-up resistor. The voltage source Q supplies the "high" input level when the field effect transistors are off, i.e., not conducting, as a result of a "low" test signal from the driver amplifier DRV applied to their gate electrodes. On the other hand, 0 V or ground potential is applied to signal inputs X of the chips 1, 2, . . . , n when the field effect transistors FET1, FET2, . . . , FETn are on, i.e., conducting, as a result of a "high" test signal from the driver amplifier. This means that the signal buffering circuits invert the signal in each case. If one uses a depletion-type p-channel MOS field effect transistor for the field effect transistors FET1, FET2, . . . , FETn, the test signal from the driver amplifier DRV is not inverted. It is possible to define the rising edge by selecting the transconductance of the field effect transistors and the quality of the pull-up resistors R1, R2, . . . , Rn.

The freely selectable voltage source Q may be contained in the test equipment or may be an external voltage source separate from the test equipment. If an external voltage source is used, levels that are not available from the test equipment can be applied to the signal inputs X of the chips. In addition, in the case of an external voltage source Q, more different levels than are available from the test equipment can be applied owing to the unrestricted selection of the voltage source. The unrestricted selection of the voltage source Q means that more current can be drawn in total than from a driver amplifier DRV, thereby enabling an increase in the parallelism i.e., the number of chips tested in parallel or even the number of functionally identical inputs of the chips.

The exemplary embodiment of a test arrangement according to the invention described above and illustrated in FIG. 6 is provided for the testing of functionally identical signal inputs X of a plurality of chips. For this purpose the signal buffering circuits are all connected in the same way and to a single voltage source Q, and receive the test signal from a single driver amplifier DRV via a primary test channel CH.

Figure 7:
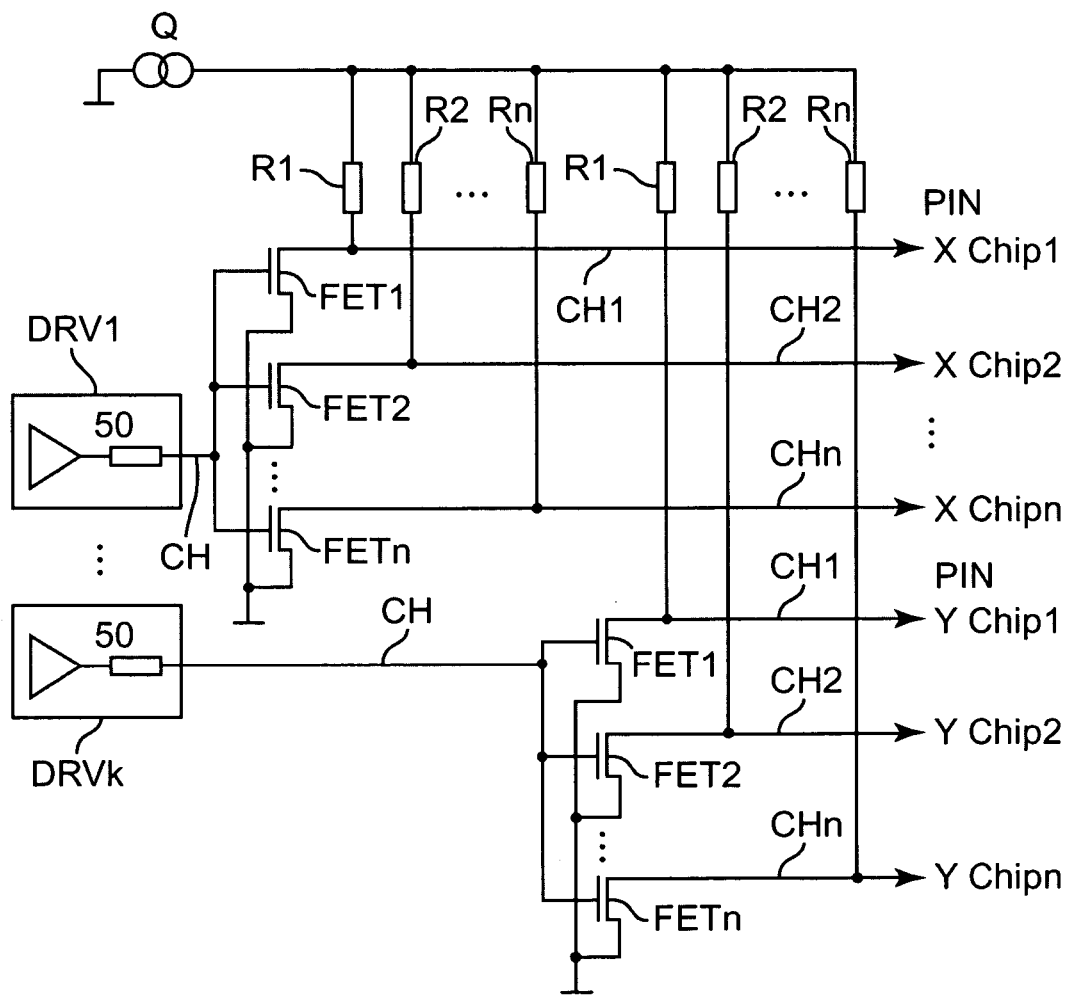
FIG. 7 illustrates schematically a second exemplary embodiment of a test arrangement according to the invention.

FIG. 7 illustrates another exemplary embodiment test arrangement schematically at 30 and is provided for buffering a plurality of shared driver units i.e. a plurality of driver amplifiers DRV1, . . . , DRVk, and for driving in parallel signal inputs or pins X, Y, each having a different function, of a plurality of chips 1–n. Each driver amplifier DRV1–DRVk is connected to the inputs i.e. the gate electrodes of one group of buffering circuits in each case, where a first group of buffering circuits distributes the test signals from the primary test channel CH to the signal inputs X, and a second group of buffering circuits distributes the test signals from the other primary test channel to the signal inputs Y, and buffers them from the respective primary channels CH. The pull-up resistors R1, R2, . . . , Rn of each group of buffering circuits are connected in common to a freely selectable voltage source Q.

The test arrangement illustrated in FIG. 7 is used if different signal forms are applied to the pins X and Y of the chips, but these chips are driven with the same levels that are set by the single freely selectable voltage source Q and the ground potential.

In addition, it is also possible to supply a driver amplifier DRV, i.e. a shared driver unit with more than one voltage source. This is possible when the signal input pins X and Y receive the same signal form of the test signal but at different levels.

Figure 8:
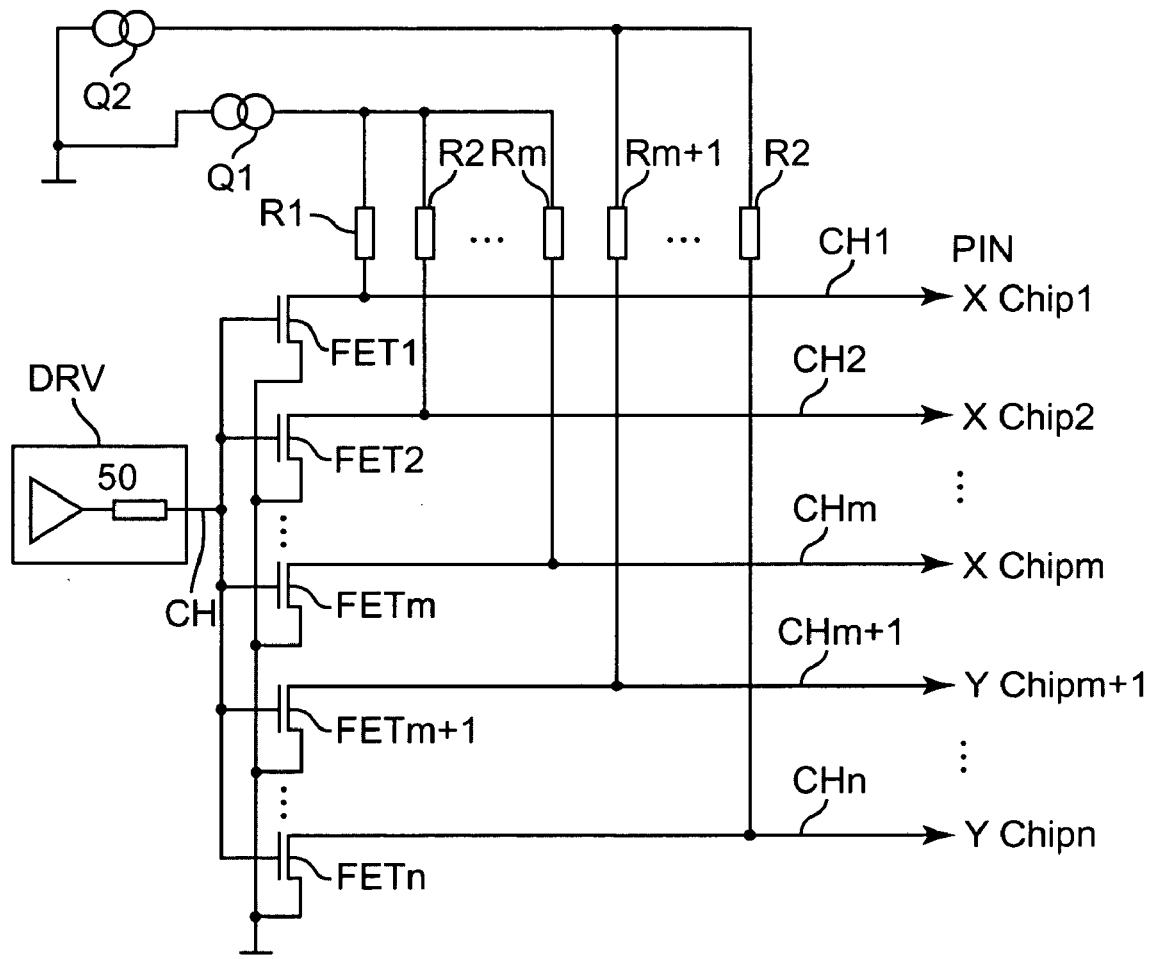
FIG. 8 illustrates schematically a third exemplary embodiment of a test arrangement according to the invention.

FIG. 8 illustrates schematically at 50 a test arrangement of this type according to the invention, which contains merely by way of example two different freely selectable voltage sources Q1 and Q2. The buffering circuits are again divided into groups, of which a first group contains the field effect transistors FET1, FET2, . . . , FETm and the pull-up resistors R1, R2, . . . , Rm, and a second group contains the field effect transistors FETm+1, . . . , FETn with the pull-up resistors Rm+1 . . . Rn. The first group of buffering circuits distributes the test signal received from the driver amplifier DRV via the primary channel CH to the sub-channels CH1, CH2, . . . , CHm and applies it to the signal inputs or pins X of Chip1–Chipm, while the second group of buffering circuits distributes the test signal from the driver amplifier DRV to the sub-channels CHm+1–CHn and applies it to the signal inputs Y. It is clear here to one skilled in the art that the test arrangements of FIGS. 7 and 8 can also be combined, so that test signals having different signal forms and different levels can also be applied to the signal inputs X, Y.

The exemplary embodiments of the test arrangement according to the invention described above with reference to FIGS. 6–8 can be implemented in all measurement arrangements for testing semiconductor circuit chips, for example in probe cards for wafer testing or wafer burn-in, motherboards for components and module tests, burn-in boards etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A test system for testing semiconductor circuit chips comprising:
    a primary test channel;
    a plurality of parallel subchannels, each subchannel configured to have a first end coupled to the primary test channel and a second end configured to be coupled to an input of separate semiconductor chips under test; and
    a buffering circuit arranged in each subchannel, wherein the buffering circuit comprises a field effect transistor and a pull-up resistor, the field effect transistor including a first electrode connected to a first end of the pull-up resistor and to the input of the separate semiconductor chip under test, and the pull-up resistor including a second end connected to at least one voltage source.

2. The test system of claim 1, wherein the buffering circuit comprises a depletion-type p-channel MOS field effect transistor.

3. The test system of claim 1, wherein the field effect transistor includes a gate electrode connected to the primary test channel and an electrode other than the first electrode and the gate electrode connected to ground.

4. The test system of claim 1, wherein the buffering circuit in each subchannel is the configured the same.

5. The test system of claim 1, comprising:
    a driver amplifier coupled to the primary channel for receiving a test signal for the test system.

6. A test system for testing semiconductor circuit chips comprising:
    a primary test channel;
    a plurality of parallel subchannels, each subchannel configured to have a first end coupled to the primary test channel and a second end configured to be coupled to an input of separate semiconductor chips under test; and
    a buffering circuit arranged in each subchannel, each buffering circuit including a field effect transistor and a pull-up resistor; and
    a driver amplifier coupled to the primary channel for receiving a test signal for the test system, wherein a gate electrode of each field effect transistor is connected in common to the drive amplifier and a drain or source electrode of each field effect transistor is connected to one end of an associated pull-up resistor and the other end of the associated pull-up resistor is connected to at least one voltage source.

7. The test system of claim 6, wherein the field effect transistors are depletion-type p-channel MOS field effect transistors.

8. The test system of claim 6, comprising a voltage source coupled to the test system.

9. The test system of claim 6, comprising a selection of voltage sources coupled to the test system.

10. A test arrangement for testing semiconductor circuit chips, the test arrangement comprising:
    a first test system comprising a first primary test channel, a plurality of parallel subchannels, each subchannel configured to have a first end coupled to the first primary test channel and a second end configured to be coupled to an input of a first set of separate semiconductor chips under test, a buffering circuit arranged in each subchannel, each buffering circuit including a field effect transistor and a pull-up resistor, and a first driver amplifier coupled to the first primary channel for receiving a first test signal, wherein a gate electrode of each field effect transistor is connected in common to the first drive amplifier; and
    a second test system comprising a second primary test channel, a plurality of parallel sub channels, each subchannel configured to have a first end coupled to the second primary test channel and a second end configured to be coupled to an input of a second set of separate semiconductor chips under test, a buffering circuit arranged in each subchannel, each buffering circuit including a field effect transistor and a pull-up resistor, and a second driver amplifier coupled to the first primary channel for receiving a first test signal, wherein a gate electrode of each field effect transistor is connected in common to the second drive amplifier;
    wherein one end of each of the pull-up resistors is connected to a freely selectable voltage source.

11. The test arrangement of claim 10, wherein a common voltage source is coupled to the first test system and the second test system.

12. The test arrangement of claim 10, wherein a selection of voltage sources are coupled to the first test system and the second test system.

13. A test arrangement for testing semiconductor circuit chips comprising:
    a primary test channel for receiving a test signal from a driver amplifier of an item of test equipment;
    a plurality of parallel sub-channels for distributing the test signal to a plurality of inputs of one or more semiconductor circuit chips under test;

a signal buffering circuit arranged in each sub-channel to receive and buffer the test signal from the driver amplifier before feeding it to the inputs of the semiconductor circuit chip(s), wherein all the signal buffering circuits have the same circuit arrangement and each includes a field effect transistor and a pull-up resistor, and where the drain or source electrode of each field effect transistor is connected to one end of the associated pull-up resistor and to the respective chip input via the associated sub-channel, the gate electrodes of the field effect transistors are connected in common to the driver amplifier, and the other electrodes of the drain and source electrodes of the field effect transistors that are not connected to the pull-up resistor are connected in common to ground, and the other ends of the pull-up resistors are connected to at least one voltage source.

14. The test arrangement of claim 13, wherein the at least one voltage source is an external voltage source, separate from the test equipment, that allows unrestricted selection of the voltages supplied by it.

15. The test arrangement of claim 14, wherein the inputs of the semiconductor circuit chips under test are functionally identical and exactly one voltage source is provided.

16. The test arrangement of claim 13, wherein the inputs of the semiconductor circuit chips under test are functionally identical and exactly one voltage source is provided.

17. The test arrangement of claim 13, wherein it is designed for one driver amplifier and has a plurality of buffering circuit groups which, supplied by a dedicated voltage source for each group, transmit to functionally non-identical inputs via the sub-channels test signals having different levels but the same signal form.

18. The test arrangement of claim 13, wherein it is designed for a plurality of driver amplifiers and a corresponding number of primary test channels, and has exactly one voltage source and a plurality of buffering circuit groups supplied by this, each of which is connected on the input side to one of the primary test channels, and transmits to functionally non-identical inputs test signals that have a different signal form for each group but the same level.

19. The test arrangement of claim 14, wherein it is designed for a plurality of driver amplifiers and a corresponding number of primary test channels, and has exactly one voltage source and a plurality of buffering circuit groups supplied by this, each of which is connected on the input side to one of the primary test channels, and transmits to functionally non-identical inputs test signals that have a different signal form for each group but the same level.

20. The test arrangement of claim 13, the field effect transistors are depletion-type p-channel MOS field effect transistors.

* * * * *